US009312468B2

(12) United States Patent
Sohn et al.

(10) Patent No.: US 9,312,468 B2
(45) Date of Patent: Apr. 12, 2016

(54) NANO-PIEZOELECTRIC GENERATOR AND METHOD OF MANUFACTURING THE SAME

(71) Applicant: SAMSUNG ELECTRONICS CO., LTD., Suwon-si (KR)

(72) Inventors: Jung-inn Sohn, Hwaseong-si (KR); Seung-nam Cha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 319 days.

(21) Appl. No.: 13/774,039

(22) Filed: Feb. 22, 2013

(65) Prior Publication Data

US 2013/0221806 A1    Aug. 29, 2013

(30) Foreign Application Priority Data

Feb. 23, 2012  (KR) .................. 10-2012-0018655

(51) Int. Cl.
| | |
|---|---|
| *H01L 41/113* | (2006.01) |
| *H01L 41/22* | (2013.01) |
| *H01L 41/047* | (2006.01) |
| *H01L 41/29* | (2013.01) |
| *H01L 41/18* | (2006.01) |
| *H02N 2/18* | (2006.01) |
| *H01L 41/187* | (2006.01) |

(52) U.S. Cl.
CPC ............ *H01L 41/113* (2013.01); *H01L 41/047* (2013.01); *H01L 41/0478* (2013.01); *H01L 41/18* (2013.01); *H01L 41/187* (2013.01); *H01L 41/22* (2013.01); *H01L 41/29* (2013.01); *H02N 2/18* (2013.01)

(58) Field of Classification Search
USPC .......................................... 310/339; 29/25.35
See application file for complete search history.

(56) References Cited

U.S. PATENT DOCUMENTS

| | | | |
|---|---|---|---|
| 7,705,523 B2 | 4/2010 | Wang et al. | |
| 8,039,834 B2 | 10/2011 | Wang et al. | |
| 8,330,154 B2 | 12/2012 | Wang et al. | |
| 2006/0151820 A1* | 7/2006 | Duan et al. | ................... 257/296 |
| 2007/0023621 A1* | 2/2007 | Blick et al. | ................... 250/251 |
| 2010/0117488 A1 | 5/2010 | Wang et al. | |
| 2010/0253184 A1* | 10/2010 | Choi et al. | ................... 310/339 |
| 2011/0101315 A1 | 5/2011 | Choi et al. | |
| 2011/0275947 A1 | 11/2011 | Feldman et al. | |

(Continued)

FOREIGN PATENT DOCUMENTS

| | | |
|---|---|---|
| KR | 10-2010-0032175 A | 3/2010 |
| KR | 1020110135293 A | 12/2011 |

(Continued)

OTHER PUBLICATIONS

Zhong Lin Wang et al., "Piezoelectric Nanogenerators Based on Zinc Oxide Nanowire Arrays", Science vol. 312, Apr. 14, 2006, pp. 242-246, URL: http://www.sciencemag.org.

(Continued)

*Primary Examiner* — Thomas Dougherty
(74) *Attorney, Agent, or Firm* — Sughrue Mion, PLLC

(57) ABSTRACT

A nano-piezoelectric generator includes a first electrode and a second electrode, at least one nano-piezoelectric unit, formed of a semiconductor piezoelectric material having a nano-structure, disposed between the first and the second electrodes, and an interlayer, formed of an insulating material, disposed between the first electrode and the at least one nano-piezoelectric unit.

21 Claims, 10 Drawing Sheets

(56) References Cited

U.S. PATENT DOCUMENTS

| | | |
|---|---|---|
| 2011/0309354 A1 | 12/2011 | Wang et al. |
| 2012/0038249 A1 | 2/2012 | Lu et al. |
| 2012/0306319 A1* | 12/2012 | Park .............................. 310/339 |

FOREIGN PATENT DOCUMENTS

| | | |
|---|---|---|
| KR | 1020120100294 A | 9/2012 |
| KR | 1020130011137 A | 1/2013 |
| KR | 1020130083091 A | 7/2013 |

OTHER PUBLICATIONS

Rusen Yang et al., "Power generation with laterally packaged piezoelectric fine wires", Nature Nanotechnology, vol. 4, Jan. 2009, Nov. 9, 2008 (Published Online), pp. 34-39, URL: http://www.nature.com/naturenanotechnology.

Communication dated Aug. 20, 2014 issued by the European Patent Office in counterpart European Application No. 13151703.9.

* cited by examiner

NANO-PIEZOELECTRIC GENERATOR AND METHOD OF MANUFACTURING THE SAME

CROSS-REFERENCE TO RELATED APPLICATION

This application claims priority from Korean Patent Application No. 10-2012-0018655, filed on Feb. 23, 2012, in the Korean Intellectual Property Office, the disclosure of which is incorporated herein in its entirety by reference.

BACKGROUND

1. Field

Apparatuses and methods consistent with exemplary embodiments relate to nano-piezoelectric generators and methods of manufacturing the nano-piezoelectric generators.

2. Description of the Related Art

Piezoelectric generators are devices for converting mechanical vibrations into electrical energy, and may be used as power sources for small-sized devices and sensors or may be used as sensors for sensing mechanical vibrations.

Recently, nanopiezotronics, which is a field which utilizes the piezoelectric phenomenon on a nanoscopic scale, has been researched. The piezoelectric efficiency of a nano-structure, in comparison to that of a bulk structure, may be improved because of a strain confinement effect. That is, in a bulk structure, strain generated due to stress occurs in a direction in which the stress is not applied, as well as in a direction in which the stress is applied, and thus the strain is dispersed. However, in a nano-structure, and in particular, in a nano-wire structure, that is, a one-dimensional nano-structure, strain is restricted to only a length direction of the nano-wire structure in which stress is applied, and thus a high piezoelectric coefficient may be obtained.

On the other hand, well known piezoelectric materials, such as lead zirconate titanate (PZT) and barium titanium oxide (BTO), are not suitable for nano-wiring and include substances that are harmful to human beings. Thus, recently, a material that is suitable for nano-wiring, such as ZnO or GaN, has been actively researched as a new nano-piezoelectric material.

SUMMARY

One or more exemplary embodiments may provide nano-piezoelectric generators having an improved piezoelectric efficiency and methods of fabricating the nano-piezoelectric generators.

Additional aspects will be set forth in part in the description which follows and, in part, will be apparent from the description, or may be learned by practice of the presented embodiments.

According to an aspect of an exemplary embodiment, a nano-piezoelectric generator includes: a first electrode and a second electrode; at least one nano-piezoelectric unit formed of a semiconductor piezoelectric material having a nano-structure between the first and the second electrodes; and an interlayer formed of an insulating material between the first electrode and the at least one nano-piezoelectric unit.

The interlayer may include an oxide or a polymer. The interlayer may include $WO_3$, $HfO_2$, $Al_2O_3$, $ZrO_2$, $Si_3N_4$, $Ta_2O_5$, $MgO$, $Y_2O_3$, $La_2O_3$, $HaSiO_4$, $SiO_2$, $MoO_3$ or $VO_2$.

The first electrode may be formed of a metal material, a conductive oxide, or a conductive polymer.

The nano-piezoelectric unit may include ZnO or GaN.

The nano-piezoelectric unit may include: a nano-structure containing a predetermined first carrier; and a density adjusting unit for adjusting a density of the first carrier.

The density adjusting unit may include a second carrier that is doped in the nano-structure and has a polarity opposite to that of the first carrier. The nano-structure may be formed of a ZnO semiconductor nano-wire, and the second carrier may be p-type impurities. The p-type impurities may be Li.

The density adjusting unit may include a functional group attached to a surface of the nano-structure and having the same polarity as that of the first carrier. The nano-structure may be formed of a ZnO semiconductor nano-wire, and the functional group may have negative charges.

The density adjusting unit may include a ferroelectric material coated on a surface of the nano-structure.

According to an aspect of another exemplary embodiment, a method of manufacturing a nano-piezoelectric generator includes: forming an interlayer formed of an insulating material on a first electrode; forming at least one nano-piezoelectric unit formed of a semiconductor piezoelectric material and having a nano-structure on a second electrode; and bonding the at least one nano-piezoelectric unit to the interlayer.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
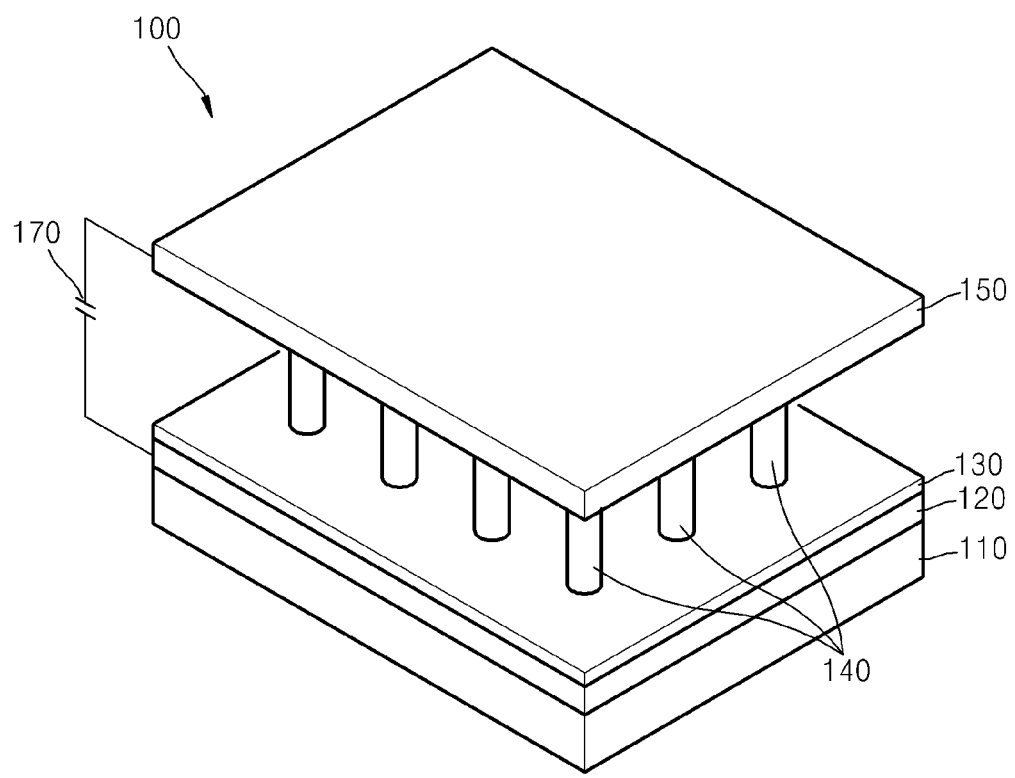
FIG. 1 is a schematic perspective view of a nano-piezoelectric generator according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description. Expressions such as "at least one of," when preceding a list of elements, modify the entire list of elements and do not modify the individual elements of the list.

FIG. 1 is a schematic perspective view of a nano-piezoelectric generator 100 according to an exemplary embodiment.

Referring to FIG. 1, the nano-piezoelectric generator 100 includes a first electrode 120, a second electrode 150, nano-piezoelectric units 140 formed between the first electrode 120 and the second electrode 150, and an interlayer 130 formed between the first electrode 120 and at least one of the nano-piezoelectric units 140.

The nano-piezoelectric generator 100 is a device for converting mechanical energy that is generated due to fine vibrations or movements into electrical energy, and includes the nano-piezoelectric units 140 having a nano-structure for improving a piezoelectric performance and the interlayer 130 formed of an insulating material.

The nano-piezoelectric generator 100 will be described in more detail as follows.

Each of the nano-piezoelectric units 140 is formed of a semiconductor piezoelectric material having a nano-structure. The semiconductor piezoelectric material may be, for example, ZnO or GaN. The nano-structure may be a nanorod, a nanowire, a nanopore, or a nanotube, but the present embodiment is not limited thereto. In addition, the nano-piezoelectric units 140 may have various cross-sectional shapes such as a hexagonal shape or a square shape, or may have cross-sections that vary in area in a growth axis direction, such as a nano needle. A nano-structure may have a piezoelectric efficiency superior to that of a bulk structure because of the strain confinement effect. That is, in a bulk structure, strain generated due to stress occurs in a direction in which the stress is not applied, as well as in a direction in which the stress is applied, and thus the strain is dispersed. However, in a nano-structure, and in particular, in a nano-wire structure, that is, a one-dimensional nano-structure, strain is restricted to only a length direction of the nano-wire structure in which the stress is applied, and thus a high piezoelectric coefficient may be obtained.

The interlayer 130 may be disposed between one of the first and second electrodes 120 and 150 and the nano-piezoelectric units 140. For example, the interlayer 130 may be disposed between the first electrode 120 and the nano-piezoelectric units 140 as shown in FIG. 1.

In general, a Schottky contact occurs between an electrode and a semiconductor in a generator using a semiconductor piezoelectric material. When a mechanical force is applied to a piezoelectric material from the outside, a piezoelectric voltage is generated in the piezoelectric material, forming Fermi energy levels of electrodes, and a flow of electrons is generated in an external circuit in order for the Fermi energy levels of the electrodes to coincide. In order that the flow of electrons for making a balanced state occurs only in an external circuit, a high Schottky barrier is required to be formed between a semiconductor piezoelectric material and an electrode. However, there may be a leakage current through an interface, even with a Schottky barrier, and this lowers a generated voltage and reduces an energy generating efficiency. In order to address the above problem, a Schottky barrier has to be higher. However, there is a limitation in selecting a material for forming an electrode. For example, an expensive material having a high work function, such as Pt and Au, has to be used.

In the present embodiment, the interlayer 130 formed of an insulating material is disposed between an electrode and a semiconductor to circumvent the limitation in electrode material selection and to reduce the interface leakage current, and thus a piezoelectric efficiency is improved.

The interlayer 130 may be formed of various insulating materials. For example, an oxide material, a polymer, or a compound thereof may be used. The oxide material may be, for example, $WO_3$, $HfO_2$, $Al_2O_3$, $ZrO_2$, $Si_3N_4$, $Ta_2O_5$, $MgO$, $Y_2O_3$, $La_2O_3$, $HaSiO_4$, $SiO_2$, $MoO_3$ or $VO_2$.

The first electrode 120 and the second electrode 150 may be formed of, for example, Au, Ag, Al, Cu, Pd, Pt, Ru, Ni, Co, Al, or a compound thereof. In addition, the first and second electrodes 120 and 150 may be formed of a transparent and flexible conductive material, for example, a conductive oxide such as indium tin oxide (ITO) or indium zinc oxide (IZO), a conductive polymer, or a compound thereof. Otherwise, the first and second electrodes 120 and 150 may be formed of carbon nanotube, conductive polymer, nanofiber, nano-composite, or graphene.

In addition, as shown in FIG. 1, the nano-piezoelectric generator 100 may further include a substrate 110. The substrate 110 may be formed of various materials, for example, the substrate 110 may be a solid substrate such as a glass substrate or a silicon substrate. In addition, the substrate 110 may be a flexible substrate such as a plastic substrate or a fabric substrate; however, exemplary embodiments are not limited thereto. On the other hand, if the substrate 110 includes a conductive material, the substrate 110 may function as an electrode instead of the first electrode 120. For example, when the substrate 110 includes silicon doped at a high concentration, the first electrode 120 may be omitted.

An external load 170 is connected to the first and second electrodes 120 and 150 to store or consume electricity generated by the nano-piezoelectric generator 100. When a mechanical force or energy, for example, fine vibrations, wind, sound, or movements of human beings, is applied to the nano-piezoelectric generator 100 from the outside, the nano-piezoelectric units 140 are transformed. In addition, when an external force applied to the nano-piezoelectric generator 100 is removed, the nano-piezoelectric units 140 are returned to their original state. As described above, due to a piezoelectric property of the nano-piezoelectric units 140, when a shape of the nano-piezoelectric units 140 is changed or recovered, a predetermined voltage is induced between the first and second electrodes 120 and 150, which are connected to opposite ends of the nano-piezoelectric units 140. When the external load 170 is a capacitor, electricity generated by the nano-piezoelectric generator 100 may be stored in the capacitor. In addition, if the external load 170 is a nano-device, electricity generated by the nano-piezoelectric generator 100 may be consumed by the nano-device. As described above, the nano-piezoelectric generator 100 may convert mechanical energy into electrical energy.

Figure 2A:
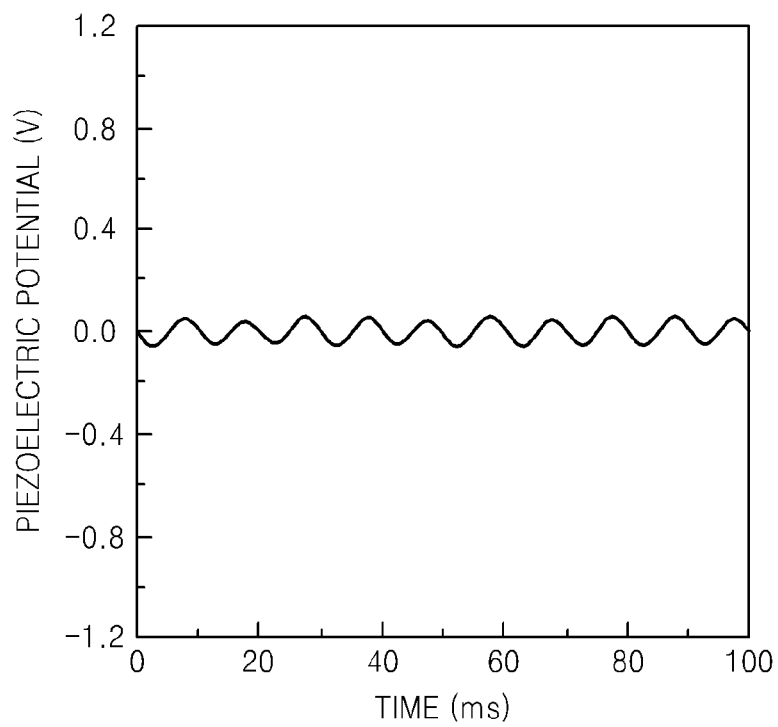
FIGS. 2A and 2B are graphs showing piezoelectric potentials of a nano-piezoelectric generator according to a comparative example.
Figure 2B:
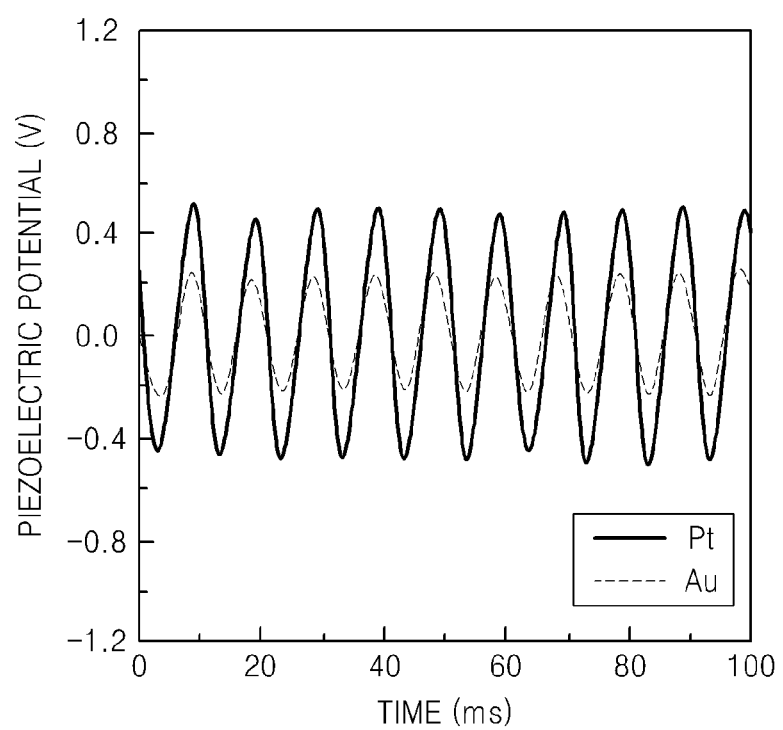

FIGS. 2A and 2B are graphs showing piezoelectric potentials of a nano-piezoelectric generator according to a comparative example.

The nano-piezoelectric generator according to the comparative example does not include an interlayer. FIG. 2A shows a case in which ITO is used to form an electrode, and FIG. 2B shows a case in which Pt or Au is used to form an electrode.

Referring to FIGS. 2A and 2B, a piezoelectric potential when ITO is used to form an electrode is lower than that when Pt or Au, that is, a metal material, is used to form an electrode. In addition, when Pt, which has a high work function, is used to form an electrode, a piezoelectric potential is higher than that when Au is used to form an electrode. From the graphs, there is a limitation in selecting an electrode material for improving a piezoelectric efficiency.

Figure 3A:
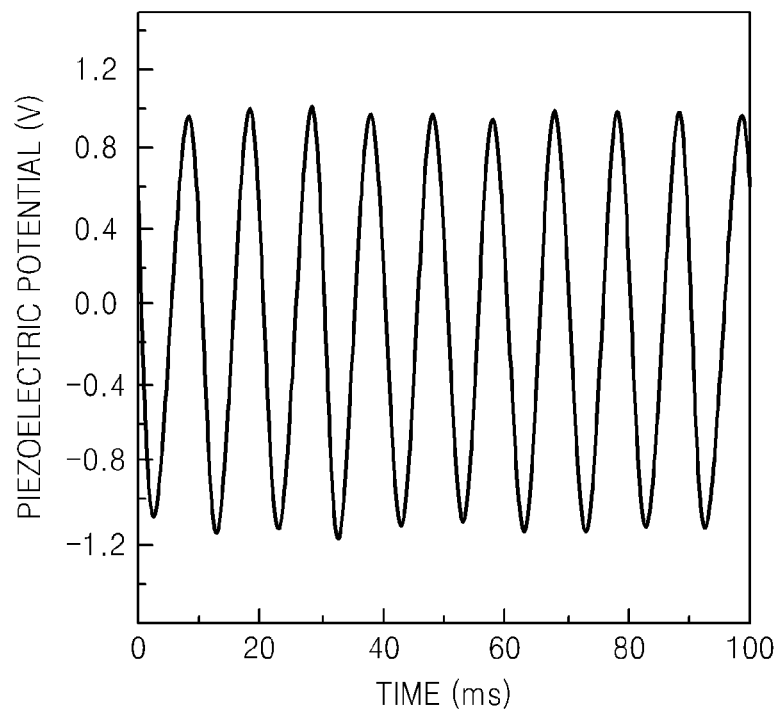
FIGS. 3A and 3B are graphs showing piezoelectric potentials of the nano-piezoelectric generator shown in FIG. 1, where materials of an interlayer are respectively MoO3 and VO2.
Figure 3B:
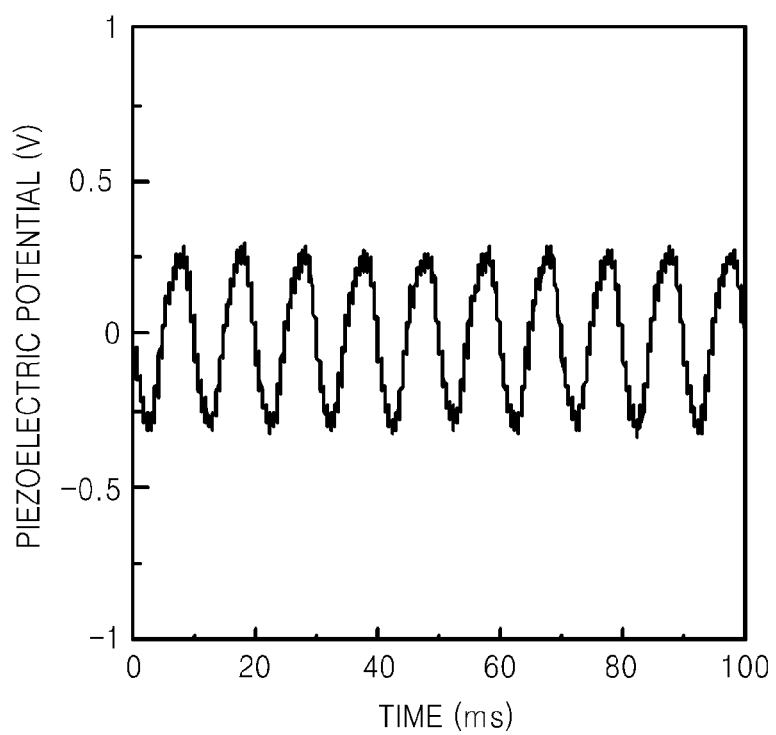

FIGS. 3A and 3B are graphs showing piezoelectric potentials of the nano-piezoelectric generator 100 shown in FIG. 1, wherein FIG. 3A shows a case where the interlayer 130 is formed of $MoO_3$ and FIG. 3B shows a case where the interlayer 130 is formed of $VO_2$.

The graphs of FIGS. 3A and 3B show piezoelectric potentials when an electrode is formed of ITO.

Referring to FIG. 3A, a piezoelectric potential is much higher than that of FIG. 2A where an interlayer is not formed and an electrode is formed of ITO, that is, the piezoelectric potential is about 20 times higher than that of FIG. 2A. In addition, when compared with the graph of FIG. 2B where an electrode is formed of Pt, which has a work function similar to that of $MoO_3$, the piezoelectric potential is at least twice as great.

Referring to FIG. 3B, a piezoelectric potential is improved when the interlayer 130 is formed of $VO_2$.

Figure 4:
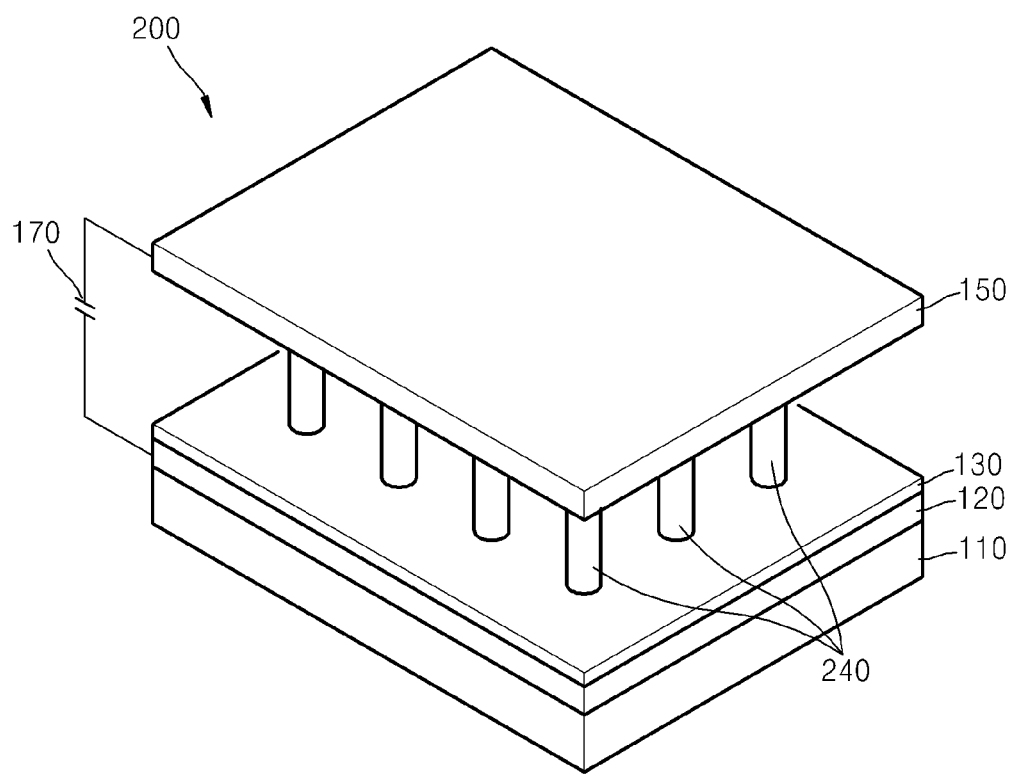
FIG. 4 is a schematic perspective view of a nano-piezoelectric generator according to another exemplary embodiment.

FIG. 4 is a perspective view of a nano-piezoelectric generator 200 according to another exemplary embodiment.

The nano-piezoelectric generator 200 of the present embodiment is different from the nano-piezoelectric generator 100 of FIG. 1 with respect to the structure of a nano-piezoelectric units 240.

Each nano-piezoelectric unit 240 includes a nano-structure including a predetermined first carrier therein, and a density adjusting unit for adjusting a density of the first carrier.

For example, the density adjusting unit may be a second carrier having a polarity opposite to that of the first carrier and doped in the nano-structure. When the nano-structure is a ZnO nano-wire, the first carrier may be an n-type carrier and the second carrier may be a p-type carrier, and Li may be used as the p-type carrier.

The above structure is derived from a characteristic that a piezoelectric efficiency is improved as a carrier density in a nano-structure is lowered, and thus the density of the first carrier in the nano-structure of the nano-piezoelectric unit 240 is controlled and the interlayer 130 is formed in the nano-piezoelectric generator 200 in order to realize a high piezoelectric efficiency.

Figure 5:
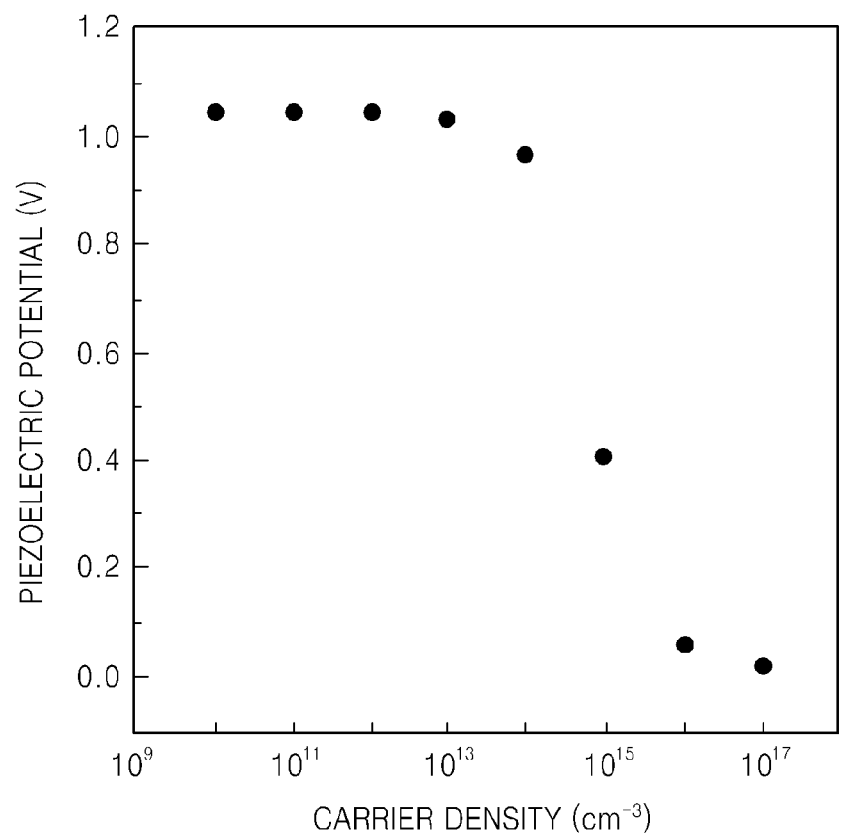
FIG. 5 is a computer simulation graph showing a piezoelectric potential with respect to a density of carriers in a ZnO nano-wire.

FIG. 5 is a computer simulation graph showing a piezoelectric potential with respect to a carrier density in a ZnO nano-wire. In the computer simulation, the ZnO nano-wire is modeled as a hexagonal prism having a diameter of 200 nm and a length of 600 nm. Here, a diameter is a length of the longest diagonal line of a hexagon base of the hexagonal prism. A bottom surface of the ZnO nano-wire is bonded to a substrate and electrically grounded, and an external stress (Tz) of $10^7$ $N/m^2$ is applied from a top surface of the ZnO nano-wire along a length direction of the nano-wire. An induced piezoelectric potential is calculated as a function of density at a center of the top surface of the ZnO nano-wire. Referring to the graph of FIG. 5, when the carrier density is increased, the piezoelectric potential is lowered. In addition, when the carrier density is greater than about $10^{15}/cm^3$, the piezoelectric potential is sharply lowered.

Figure 6A:
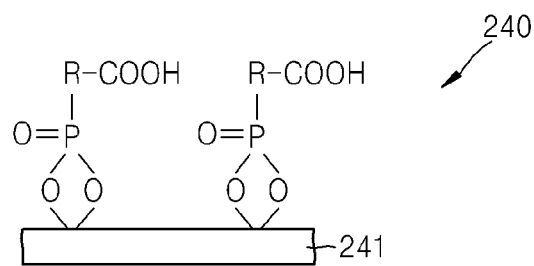
FIGS. 6A through 6C are diagrams showing examples of a nano-piezoelectric unit that may be adopted in the nano-piezoelectric generator of FIG. 4, wherein functional groups are attached to a surface of a nano-structure.
Figure 6B:
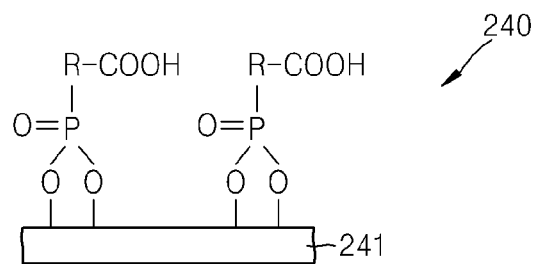
Figure 6C:
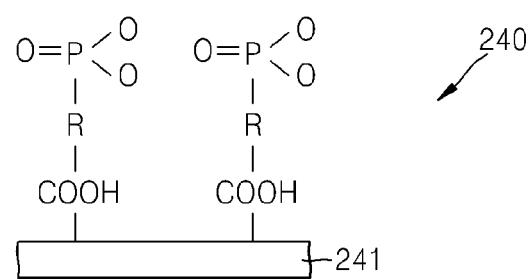

FIGS. 6A through 6C are diagrams showing other examples of the nano-piezoelectric unit 240 that may be included in the nano-piezoelectric generator 200 of FIG. 4.

The nano-piezoelectric unit 240 includes a nano-structure 241 including a predetermined first carrier therein and a functional group attached on a surface of the nano-structure 241. The functional group has electric charges of the same polarity as that of the first carrier, for example, the nano-structure 241 may be formed of the ZnO semiconductor nano-wire, and as shown in the drawings, the functional group may be a carboxyl group of negative charges.

Figure 7:
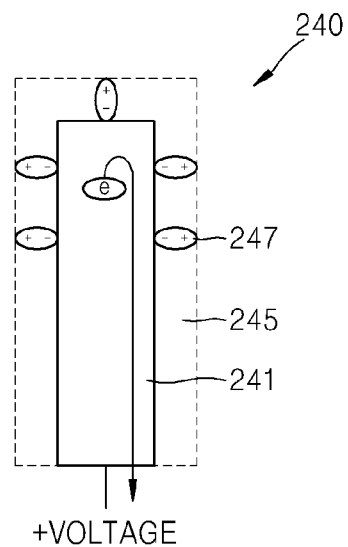
FIG. 7 is a conceptual view showing another example of a nano-piezoelectric unit that may be adopted in the nano-piezoelectric generator of FIG. 4, wherein a ferroelectric material is applied on a surface of a nano-structure so as to control a density of carriers in the nano-structure.

FIG. 7 is a diagram showing another example of the nano-piezoelectric unit 240 that may be included in the nano-piezoelectric generator 200 of FIG. 4.

The nano-piezoelectric unit 240 includes the nano-structure 241 including a predetermined first carrier and a ferroelectric substance 245 applied on a surface of the nano-structure 241. The ferroelectric substance 245 coated on the surface of the nano-structure 241 aligns an electric dipole 247 in a direction to control a density of an internal carrier. As shown in FIG. 7, when the ferroelectric substance 245 applies a positive voltage to the nano-structure 241 of a nano-wire shape, negative charges are concentrated on a side of the ferroelectric substance 245 relatively close to the nano-wire and positive charges are concentrated on a side of the ferroelectric substance 245 relatively far from the nano-wire. As described above, since the electric dipole 247 of the ferroelectric substance 245 is aligned, electrons (e) in the nano-wire are discharged to the outside due to Coulomb force, a repulsive force, thereby controlling the density of the internal carrier. The ferroelectric substance 245 may be formed of PVDF, BTO, or PZT.

Figure 8A:
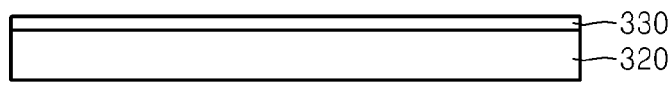
FIGS. 8A through 8C are diagrams illustrating a method of manufacturing a nano-piezoelectric generator according to an exemplary embodiment.
Figure 8B:
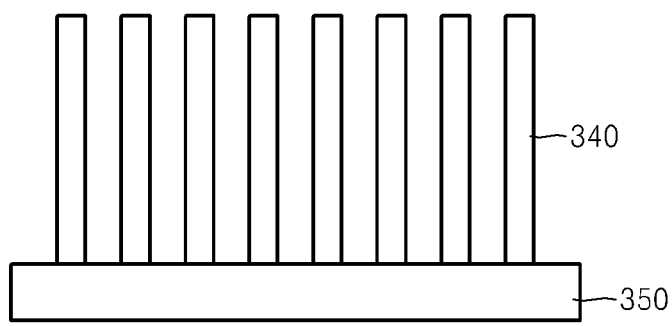
Figure 8C:
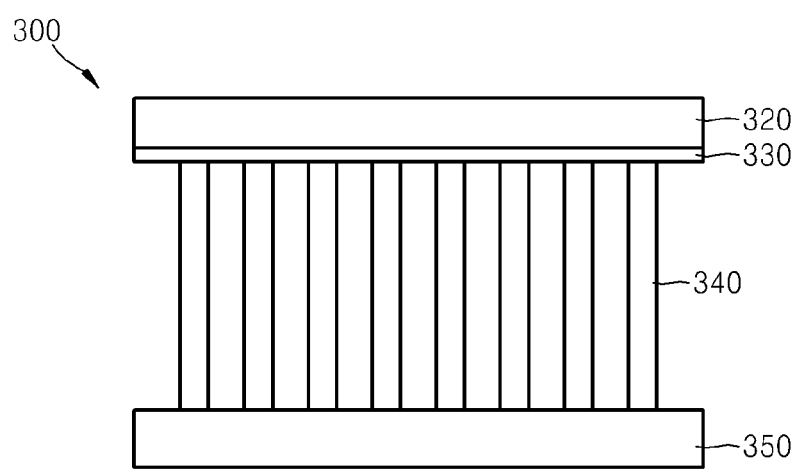

FIGS. 8A through 8C are diagrams illustrating a method of manufacturing a nano-piezoelectric generator 300 according to an exemplary embodiment.

As shown in FIG. 8A, a first electrode 320 is prepared, and an interlayer 330, formed of an insulating material, is formed on the first electrode 320. For convenience of manufacturing, the first electrode 320 may be formed on a substrate (not shown). The first electrode 320 may be formed of a metal material, a conductive oxide, or a conductive polymer. The interlayer 330 may be formed of an oxide material, a polymer, or a combination thereof. The interlayer 330 may be formed in various ways according to the material forming the interlayer 330, for example, sol-gel synthesis, thermal evaporation, electron beam evaporation, sputtering, laser ablation, or spin coating.

As shown in FIG. 8B, nano-piezoelectric units 340, each formed of a semiconductor piezoelectric material, are formed on a second substrate 350. The nano-piezoelectric units 340 may be formed of GaN or ZnO, and may be formed as nano-rods, nano-pores, or nano-tubes, or formed to have nano-wire shapes, as shown in FIG. 8B. In addition, the nano-piezoelectric unit 340 may include a nano-structure including a first carrier therein and a density adjusting unit for adjusting a density of the first carrier, as described with reference to FIG. 4.

Next, as shown in FIG. 8C, the nano-piezoelectric units 340 and the interlayer 330 are bonded to each other to manufacture the nano-piezoelectric generator 300. For bonding the nano-piezoelectric units 340 and the interlayer 330, for example, an entire structure may be fixed by using an epoxy; however, exemplary embodiments are not limited thereto.

Accordingly, a nano-piezoelectric generator according to one or more exemplary embodiments may include an interlayer formed of an insulating material is inserted between an electrode and a piezoelectric material so as to increase a selection range of electrode materials and to improve a piezoelectric efficiency.

In addition, a structure for adjusting a carrier density in a nano-structure may be formed, thereby further improving the piezoelectric efficiency.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A nano-piezoelectric generator comprising:
a first electrode and a second electrode;
at least one nano-piezoelectric unit, comprising a nano-structure formed of a semiconductor piezoelectric material, disposed between the first electrode and the second electrode; and
an interlayer, formed of an insulating material, disposed on and substantially covering the first electrode, between the first electrode and the at least one nano-piezoelectric unit, such that the nano-structure extends between the insulating material at a first end of the nano-structure and the second electrode at a second end of the nano-structure, opposite the first end.

2. The nano-piezoelectric generator of claim 1, wherein the interlayer comprises one of an oxide and a polymer.

3. The nano-piezoelectric generator of claim 1, wherein the interlayer comprises one of $WO_3$, $HfO_2$, $Al_2O_3$, $ZrO_2$, $Si_3N_4$, $Ta_2O_5$, MgO, $Y_2O_3$, $La_2O_3$, $HaSiO_4$, $SiO_2$, $MoO_3$ and $VO_2$.

4. The nano-piezoelectric generator of claim 1, wherein the first electrode is formed of one of a metal material, a conductive oxide, and a conductive polymer.

5. The nano-piezoelectric generator of claim 1, wherein the nano-piezoelectric unit comprises one of ZnO and GaN.

6. The nano-piezoelectric generator of claim 1, wherein the nano-piezoelectric unit comprises:
a nano-structure comprising a first carrier; and
a density adjusting unit which enables adjustment of a density of the first carrier.

7. The nano-piezoelectric generator of claim 6, wherein the density adjusting unit comprises a second carrier that is doped in the nano-structure and has a polarity opposite to a polarity of the first carrier.

8. The nano-piezoelectric generator of claim 7, wherein the nano-structure is a ZnO semiconductor nano-wire, and the second carrier comprises p-type impurities.

9. The nano-piezoelectric generator of claim 8, wherein the p-type impurities are Li.

10. The nano-piezoelectric generator of claim 6, wherein the density adjusting unit comprises a functional group attached to a surface of the nano-structure and wherein a polarity of the functional group is the same as a polarity of the first carrier.

11. The nano-piezoelectric generator of claim 10, wherein the nano-structure is a ZnO semiconductor nano-wire, and the functional group has negative charges.

12. The nano-piezoelectric generator of claim 6, wherein the density adjusting unit
comprises a ferroelectric material coated on a surface of the nano-structure.

13. A method of manufacturing a nano-piezoelectric generator, the method comprising:
forming an interlayer, comprising an insulating material, on a first electrode;
forming at least one nano-piezoelectric unit, comprising a nano-structure formed of a semiconductor piezoelectric material, on a second electrode; and
bonding the at least one nano-piezoelectric unit to the interlayer.

14. The method of claim 13, wherein the interlayer comprises one of an oxide and a polymer.

15. The method of claim 13, wherein the interlayer comprises one of $WO_3$, $HfO_2$, $Al_2O_3$, $ZrO_2$, $Si_3N_4$, $Ta_2O_5$, MgO, $Y_2O_3$, $La_2O_3$, $HaSiO_4$, SiO2, MoO3 and $VO_2$.

16. The method of claim 13, wherein the first electrode comprises one of a metal material, a conductive oxide, and a conductive polymer.

17. The method of claim 13, wherein the nano-piezoelectric unit comprises one of ZnO and GaN.

18. The method of claim 13, wherein the forming the at least one nanopiezoelectric unit comprises:
forming at least one nano-structure comprising a first carrier in the nano-structure; and
adjusting a density of the first carrier.

19. The method of claim 18, wherein the adjusting the density of the first carrier comprises doping a second carrier when the nano-structure is formed, wherein a polarity of the second carrier is opposite to a polarity of the first carrier.

20. The method of claim 18, wherein the adjusting the density of the first carrier comprises attaching a functional group to a surface of the nano-structure, wherein a polarity of the functional group is the same as a polarity of the first carrier.

21. The method of claim 18, wherein the adjusting the density of the first carrier comprises coating a ferroelectric material on a surface of the nano-structure.

* * * * *